United States Patent [19]
Edelson et al.

[11] Patent Number: 6,103,298
[45] Date of Patent: *Aug. 15, 2000

[54] METHOD FOR MAKING A LOW WORK FUNCTION ELECTRODE

[75] Inventors: Jonathan Sidney Edelson, Multnomah County, Oreg.; Isaiah Watas Cox, London, United Kingdom

[73] Assignee: Borealis Technical Limited, Gibraltar

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/955,097

[22] Filed: Oct. 22, 1997

Related U.S. Application Data

[63] Continuation-in-part of application No. 08/744,574, Nov. 6, 1996, Pat. No. 5,810,980, and a continuation-in-part of application No. 08/935,196, Sep. 22, 1997, Pat. No. 5,874,039, which is a continuation-in-part of application No. 08/719,792, Sep. 25, 1996, Pat. No. 5,675,972.

[51] Int. Cl.$^7$ ..................................................... C25B 11/04
[52] U.S. Cl. ........................... 427/77; 427/78; 427/126.2; 427/226; 427/372.2; 427/419.8; 427/255.6; 204/290 R
[58] Field of Search ........................... 427/77, 78, 126.2, 427/226, 372.2, 384, 419.8, 255.6, 255.2, 255.3; 204/290 R

[56] References Cited

U.S. PATENT DOCUMENTS

| | | | |
|---|---|---|---|
| 4,484,989 | 11/1984 | Mansell | 204/59 R |
| 5,128,587 | 7/1992 | Skotheim et al. | 313/504 |
| 5,675,972 | 10/1997 | Edelson | 62/3.1 |
| 5,810,980 | 9/1998 | Edelson | 204/290 R |
| 5,874,039 | 2/1999 | Edelson | 204/290 R |

*Primary Examiner*—Timothy Meeks

[57] ABSTRACT

Methods for making low work function electrodes either made from or coated with an electride material in which the electride material has lattice defect sites are described. Lattice defect sites are regions of the crystal structure where irregularities and deformations occur. Also provided are methods for making electrodes which consist of a substrate coated with a layer of a compound comprised of a cation complexed by an electride former, in which said complex has lattice defect sites. In addition, methods for making electrodes which consist of a bulk metal coated with a layer of an electride former having lattice defect sites are described. The electride former stabilizes the loss of electrons by surface sites on the metal, lowering the workfunction of the coated surface.

27 Claims, 3 Drawing Sheets

METHOD FOR MAKING A LOW WORK FUNCTION ELECTRODE

RELATED APPLICATIONS

The present invention is a continuation-in-part of to "Low Work Function Electrode", filed Nov. 6, 1996, Ser. No. 08/744,574, issued as U.S. Pat. No. 5,810,980, and "Low Work-Function Electrode", filed Sep. 22, 1997, Ser. No. 08/935,196 issued as U.S. Pat. No. 5,874,039, which ia a continuation-in-part of "Method and Apparatus for Vacuum Diode-Based Devices with Electride-Coated Electrodes", filed Sep. 25, 1996, Ser. No. 08/719,792, issued as U.S. Pat. No. 5,675,972.

FIELD OF INVENTION

The present invention relates to emission of electrons from conductive surfaces.

BACKGROUND OF THE INVENTION

Electron Devices

Vacuum electronic devices employ a flow of electrons through a vacuum space between a cathode and an anode. Through manipulation of the voltages of intermediate electrodes, the use of magnetic fields, or other techniques, various desired end results may be achieved. For example, placing a grid like electrode between cathode and anode permits a small signal applied to said grid to greatly influence the flow of current from cathode to anode: this is the vacuum triode used for amplification. Operation of these devices depends upon the ability of the cathode to emit electrons into the vacuum.

Devices employing current flowing through a gas also require electrodes which easily emit electrons. Further, propulsion devices which operate on the principal of current flowing through diffuse plasmas in magnetic fields also depend heavily on the ability of electrodes to easily emit electrons.

Most such devices make use of the heated thermionic cathode. In such a cathode, a metal or oxide coated metal is heated until thermally excited electrons are capable of escaping from the metal. Such thermionic cathodes are capable of operation at current densities up to several hundreds of amperes per square centimeter. Such devices still find active use in high power devices such as are found in radio transmitters, however at the small scale the solid state transistor has virtually replaced the vacuum tube in all uses.

Vacuum Diode-Based Devices

In Edeleson's disclosure, filed Mar. 7, 1995, titled "Electrostatic Heat Pump Device and Method", Ser. No. 08/401,038, now abandoned two porous electrodes were separated by a porous insulating material to form an electrostatic heat pump. In said device, evaporation and ionization of a working fluid in an electric field provided the heat pumping capacity. The use of electrons as the working fluid is disclosed in that application. In my subsequent disclosure, filed Jul. 5, 1995, titled "Method and Apparatus for Vacuum Diode Heat Pump", Ser. No. 08/498,199, an improved device and method for the use of electrons as the working fluid in a heat pumping device is disclosed. In this invention, a vacuum diode is constructed using a low work function cathode.

In Edelson's further subsequent disclosure, filed Dec. 15, 1995, titled "Method and Apparatus for Improved Vacuum Diode Heat Pump", Ser. No. 08/573,074, issued as U.S. Pat. No. 5,699,668 the work function of the anode was specified as being lower than the work function of the cathode in order to optimize efficient operation.

In a yet further subsequent disclosure, filed Dec. 27, 1995, titled "Method and Apparatus for a Vacuum Diode Heat Pump With Thin Film Ablated Diamond Field Emission", Ser. No. 08/580,282, now abandoned, Cox and Edelson disclose an improvement to the Vacuum Diode Heat Pump, wherein a particular material and means of construction was disclosed to further improve upon previous methods and devices.

The Vacuum Diode at the heart of this Vacuum Diode Heat Pump may also be used as a thermionic generator: the differences between the two devices being in the operation of the diode, the types and quantities of external energy applied to it, and the provisions made for drawing off, in the instance of the thermionic converter, an electrical current, and in the instance of the Vacuum Diode Heat Pump, energy in the form of heat.

In Cox's disclosure, filed Mar. 6, 1996, titled "Method and Apparatus for a Vacuum Thermionic Converter with Thin Film Carbonaceous Field Emission", Ser. No. 08/610,599, now abandoned, a Vacuum Diode is constructed in which the electrodes of the Vacuum Diode are coated with a thin film of diamond-like carbonaceous material. A Vacuum Thermionic Converter is optimized for the most efficient generation of electricity by utilizing a cathode and anode of very low work function. The relationship of the work functions of cathode and anode are shown to be optimized when the cathode work function is the minimum value required to maintain current density saturation at the desired temperature, while the anode's work function is as low as possible, and in any case lower than the cathode's work function. When this relationship is obtained, the efficiency of the original device is improved.

Electrides and Alkalides

In Edelson's previous disclosure, entitled "Method and Apparatus for Vacuum Diode-Based Devices with Electride-Coated Electrodes", U.S. Pat. No. 5,675,972, incorporated herein by reference in its entirety, he describes Vacuum diode-based devices, including Vacuum Diode Heat Pumps and Vacuum Thermionic Generators, in which the electrodes are coated with an electride. These materials have low work functions, which means that contact potential difference between cathode and anode may be set against the effects of space charge, resulting in an improved device whereby anode and cathode may be set at a greater distance from each other than has been previously envisaged.

In a further disclosure filed Nov. 6, 1996, titled "Low Work Function Electrode", Ser. No. 08/744,574, issued as U.S. Pat. No. 5,910,980, incorporated herein by reference in its entirety, Edelson discloses a metal surface coated with a heterocyclic multidentate ligand compound, which reduces work-function and facilitates the emission of electrons.

In a further subsequent disclosure filed Sep. 22, 1997, titled "Low Work Function Electrode", Ser. No. 08/935,196, issued as U.S. Pat. No. 5,874,039 incorporated herein by reference in its entirety, Edelson discloses a substrate coated with a compound comprised of a cation complexed by a heterocyclic multidentate ligand, which provides a surface having a low work-function and facilitates the emission of electrons.

It has now been discovered that the thermionic emissive properties of electride materials are much improved following a molecular change to the crystal lattice structure of the electride.

BRIEF DESCRIPTION OF THE INVENTION

The present invention provides methods for making electrodes either made from or coated with an electride material in which the electride material has lattice defect sites. Lattice defect sites are regions of the crystal structure where irregularities and deformations occur.

The present invention also provides methods for making electrodes which consist of a substrate coated with a layer of a compound comprised of a cation complexed by an electride former, in which said complex has lattice defect sites, thereby providing a surface having a low work-function. In a preferred embodiment, the electride former is a heterocyclic multidentate ligand.

In a further embodiment, said compound is coated as a monolayer on the material surface.

In addition, the present invention provides methods for making electrodes which consist of a bulk metal coated with a layer of an electride former having lattice defect sites. The electride former stabilizes the loss of electrons by surface sites on the metal, lowering the work-function of the coated surface. In one embodiment of the present invention, said metal is an alkali metal, alkaline earth metal, or lanthanide metal. In another embodiment, said metal is an alloy comprising a mixture of one or more of alkali metals, alkaline earth metals, lanthanide metals and other metals.

In a further embodiment, the electride-forming ligand is coated in a monolayer on the metal surface.

In a yet further embodiment, a substrate is plated with a thin layer of alkali metal, alkaline earth metal, or lanthanide metal which is itself coated with a monolayer of an electride former capable of forming an electride having lattice defect sites.

OBJECTS AND ADVANTAGES

It is an object of the present invention to provide methods for making electrodes comprised of a substrate coated with a thin layer of alkali metal, alkaline earth metal, or lanthanide metal which is itself coated with a monolayer of electride forming-ligand having lattice defect sites.

It is a further object of the invention to provide methods for making electrodes comprising an alkali metal, alkaline earth metal, or lanthanide metal, the surface of which is coated with a monolayer of an electride former having lattice defect sites.

An advantage of the present invention is that the electride former coating having lattice defect sites stabilizes the loss of electrons by surface sites on the metal, thereby lowering the work function of the coated surface.

It is an object of the present invention to provide methods for making electrodes comprised of a substrate coated with a layer of a compound having lattice defect sites which is itself comprised of a cation completed by an electride former.

An advantage of the present invention is that said compound provides a surface having a low work function.

An object of the present invention is to provide improved materials for the electrodes of a Vacuum Diode Heat Pump or Vacuum Thermionic Converter having very low work functions.

An advantage of the present invention is that it employs electrodes made from or coated with an electride material having lattice defect sites giving copious electron emission at low temperatures.

An object of the present invention is to provide a Vacuum Diode Heat Pump with improved efficiency.

An object of the present invention is to provide a Vacuum Diode Thermionic Converter with improved efficiency.

REFERENCE NUMERALS IN THE DRAWINGS

1 Substrate
2 Compound
1a Conductor

DETAILED DESCRIPTION OF THE INVENTION

Figure 1A:
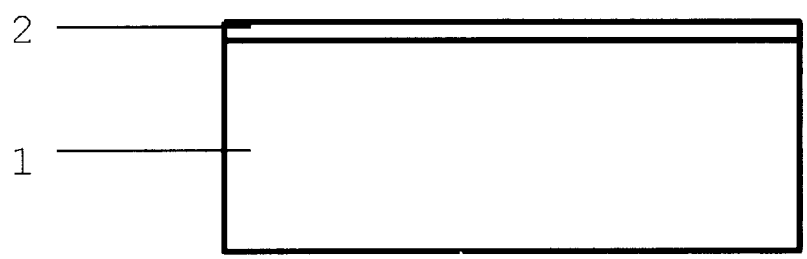
FIGS. 1A and 1B show diagrammatic representations of the low work-function electrode of the present invention.

Referring to FIG 1A, substrate 1 is coated with a layer of compound 2.

In one embodiment, compound 2 can be an electride having lattice defect sites. In one embodiment, a crystal lattice having defect sites is produced by using a mixture of electride formers to prepare the electride material. Preferred embodiments include mixtures comprised of electride formers of different molecular sizes or shapes, mixtures comprised of electride formers of different stability or the mixture is effectively formed in situ by heating for a short period of time after the electride is formed. In these mixtures, one of the electride formers may be present in greater abundance than the other. In this way, the electride former that is present in abundance will form the crystal lattice, and the electride former that is present in a smaller amount will introduce the lattice defect.

In a preferred embodiment, where substrate 1 is a metal, compound 2 can be an electride former having lattice defect sites. In one embodiment, the lattice defect sites are produced by using a mixture of electride formers. Preferred embodiments include mixtures comprised of electride formers of different molecular sizes or shapes, mixtures comprised of electride formers of different stability or the mixture is effectively formed in situ by heating for a short period of time. In these mixtures, one of the electride formers may be present in greater abundance than the other. In this way, the electride former that is present in abundance will form the crystal lattice, and the electride former that is present in a smaller amount will introduce the lattice defect. In a preferred embodiment, compound 2 is coated in a monolayer upon the surface of substrate 1.

In one embodiment, substrate 1 is composed of a transition metal, such as nickel. In another embodiment substrate 1 is an alkali metal, an alloy of metals, an alloy of alkali metals, or an alloy of transition metals. Substrate 1 may also consist of an alkaline earth metal, a lanthanide metal, an actinide metal, alloys thereof, or alloys with other metals.

The alkali metals are lithium, sodium, potassium, rubidium, cesium, and francium. The alkaline earth metals are beryllium, magnesium, calcium, strontium, barium, and radium. The lanthanide metals are lanthanum, cerium, praseodymium, neodymium, promethium, samarium, europium, gadolinium, terbium, dysprosium, holmium, erbium, thulium, ytterbium, lutetium, and hafnium. The actinide metals include actinium, thorium, protactinium, uranium, and the transuranic metals. The transition metals are scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium, hafnium, tantalum, tungsten, rhenium, osmium, iridium, platinum, gold, and mercury.

In another preferred embodiment, a metal substrate 1, preferably a silver substrate, is treated with a modified crown ether having thiol functionalities which allow it to be immobilized to the silver surface. Gas phase or solution techniques may then be used to complex cations into the immobilized crown ethers, thereby forming a layer of compound 2 on substrate 1. Lattice defects may be introduced by heating the electrode produced for a short period of time. In other embodiments, lattice defects are introduced by using a mixture of electride formers. In one such embodiment one of the formers is unstable, and decomposes to give lattice defects. In another such embodiment, one of the electride formers has a different size, which leads to the formation of a lattice defect. In these mixtures, one of the electride formers may be present in greater abundance than the other. In this way, the electride former that is present in abundance will form the crystal lattice, and the electride former that is present in a smaller amount will introduce the lattice defect.

In another embodiment substrate 1 is a non-metal, such as silicon or quartz. In a further embodiment substrate 1 is a polymeric material such as polycarbonate, polystyrene, polypropylene of polyethylene.

In a preferred embodiment, substrate 1 is composed of quartz. Layer of compound 2 is introduced by vacuum deposition. This process, which yields a thin film of compound 2 of controllable thickness and composition, involves placing the electride former and metal in separate containers under high vacuum. By manipulating the temperature of the containers, the metal and electride former are evaporated and deposited simultaneously onto a quartz surface at an adjustable rate. A solid state reaction between the electride former and metal produces the film of compound 2. In a further embodiment, compound 2 could be layered onto diamond or sapphire by vapor deposition in a similar manner. Lattice defects may be introduced by heating the electrode produced for a short period of time. In other embodiments, lattice defects are introduced by using a mixture of electride formers. In one such embodiment one of the formers is unstable, and decomposes to give lattice defects. In another such embodiment, one of the electride formers has a different size, which leads to the formation of a lattice defect. In these mixtures, one of the electride formers may be present in greater abundance than the other. In this way, the electride former that is present in abundance will form the crystal lattice, and the electride former that is present in a smaller amount will introduce the lattice defect.

Figure 1B:
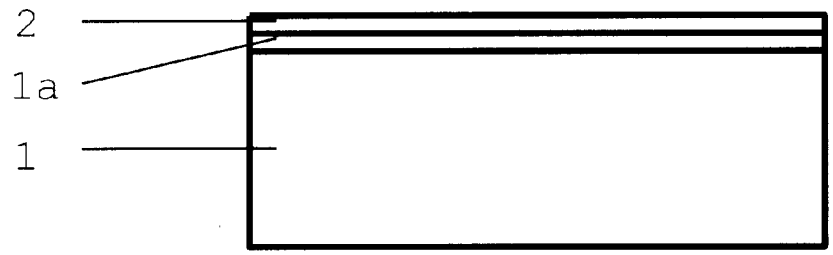
Figure 2A:
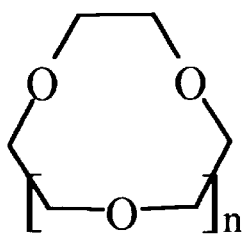
FIG. 2a is the general structure of crown ethers.
Figure 2B:
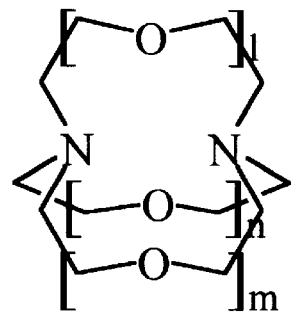
FIG. 2b is the general structure of cryptands.
Figure 2C:
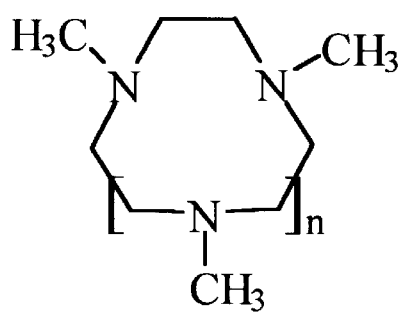
FIG. 2c is the general structure of aza-crown ethers.
Figure 2D:
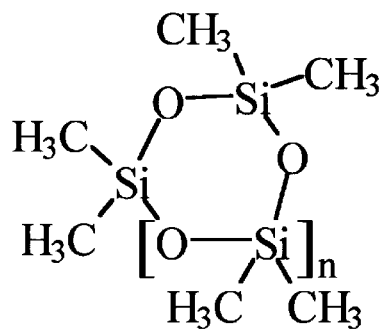
FIG. 2d is the general structure of silicone crown ethers.
Figure 2E:
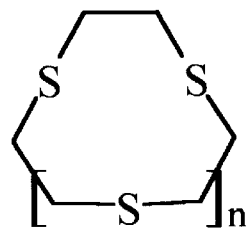
FIG. 2e is the general structure of thio-crown ethers.
Figure 3A:
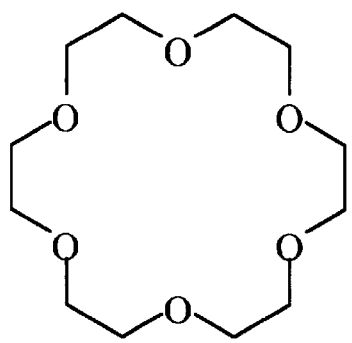
FIG. 3a is the structure of 18-crown-6.
Figure 3B:
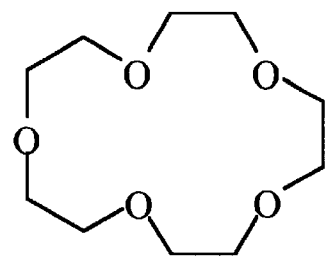
FIG. 3b is the structure of 15-crown-5.
Figure 3C:
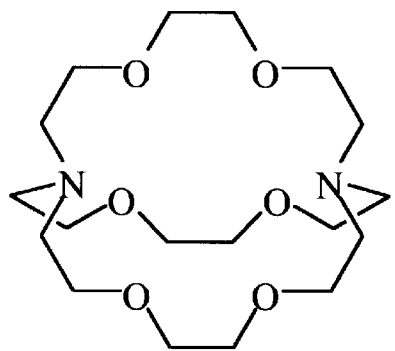
FIG. 3c is the structure of cryptand [2.2.2].
Figure 3D:
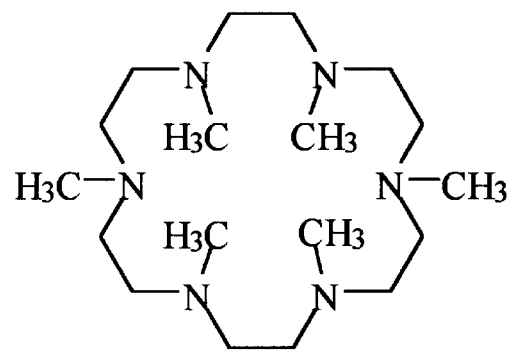
FIG. 3d is the structure of hexamethyl hexacyclen.

Referring to now FIG. 1B, substrate 1 is coated first with a layer of metal, 1A, and secondly, with a layer of compound 2.

In a preferred embodiment, substrate 1 is composed of a bulk metal plated with a metal plating 1*a*, said metal plating being an alkali metal, an alloy of alkali metals, or an alloy of alkali metal with another metal. Metal plating 1*a* may also consist of an alkaline earth metal, a lanthanide metal, an actinide metal, alloys thereof, or alloys with other metals. Lattice defects may be introduced by heating the electrode produced for a short period of time. In other embodiments, lattice defects are introduced by using a mixture of electride formers. In one such embodiment one of the formers is unstable, and decomposes to give lattice defects. In another such embodiment, one of the electride formers has a different size, which leads to the formation of a lattice defect. In these mixtures, one of the electride formers may be present in greater abundance than the other. In this way, the electride former that is present in abundance will form the crystal lattice, and the electride former that is present in a smaller amount will introduce the lattice defect.

In a particularly preferred embodiment, substrate 1 is composed of nickel, with metal electrode plating 1*a* being sodium, potassium, francium, or cesium. Both alkaline metal plating 1*a* and electride former 2 may be deposited by vacuum sublimation. Lattice defects may be introduced by heating the electrode produced for a short period of time. In other embodiments, lattice defects are introduced by using a mixture of electride formers. In one such embodiment one of the formers is unstable, and decomposes to give lattice defects. In another such embodiment, one of the electride formers has a different size, which leads to the formation of a lattice defect. In these mixtures, one of the electride formers may be present in greater abundance than the other. In this way, the electride former that is present in abundance will form the crystal lattice, and the electride former that is present in a smaller amount will introduce the lattice defect.

In yet another particularly preferred embodiment, substrate 1 is thoriated tungsten. Said cathode is produced in the conventional fashion and baked prior to coating with layer of electride former 2 to ensure a layer of thorium on the surface beneath layer 2. Lattice defects may be introduced by heating the electrode produced for a short period of time. In other embodiments, lattice defects are introduced by using a mixture of electride formers. In one such embodiment one of the formers is unstable, and decomposes to give lattice defects. In another such embodiment, one of the electride formers has a different size, which leads to the formation of a lattice defect. In these mixtures, one of the electride formers may be present in greater abundance than the other. In this way, the electride former that is present in abundance will form the crystal lattice, and the electride former that is present in a smaller amount will introduce the lattice defect.

In yet another particularly preferred embodiment, metal electrode 1 is carburized thoriated tungsten. Said cathode is produced in the conventional fashion and baked and carburized prior to coating with a layer of compound 2 to ensure a layer of thorium carbide and tungsten carbide on the surface beneath layer 2. Lattice defects may be introduced as described above.

In yet another particularly preferred embodiment, substrate 1 is cesiated tungsten. Said cathode is produced in the conventional fashion, and processed prior to coating with layer of compound 2 to ensure a layer of cesium on the surface beneath layer 2. Lattice defects may be introduced as described above.

Referring to FIG. 2 we see chemical structures for various classes of electride formers. FIG. 2*a* is the general structure of the crown-ethers. The crown-ether is a cyclic structure composed of repeated instances of $CH_2$—$CH_2$—O. The oxygen atoms make available non-bonding electron pairs which act to stabilize metal cations. FIG. 2*b* is the general structure of the cryptands. The general structure is a bicyclic poly-ether, composed of repeated instances of $CH_2$—$CH_2$—O, combined with nitrogen 'end-links' which allow for the addition of a third poly-ether chain. FIG. 2c is the general structure of the aza-crown-ethers. The aza-crown-ether, or cyclen, is a cyclic structure composed of repeated instances of $CH_2$—$CH_2$—NX, where X is $CH_3$. The nitrogen atoms each make available a single non-bonding electron pair to stabilize metal cations, while being more stable than the oxygen crown-ethers. FIG. 2d is a silicone analog to the crown-ethers, a cyclic structure composed of repeated instances of $Si(CH_3)_2$—O. FIG. 2e is the general structure of the thio-crown-ethers. The thio-crown-ether is a cyclic structure composed of repeated instances of $CH_2$—$CH_2$—S. The sulfur atoms make available non-bonding electron pairs which act to stabilize metal cations.

Referring to FIG. 3, we see specific examples of electride formers known to form electrides and alkalides. FIG. 3a is 18-Crown-6, also known by the IUPAC name 1,4,7,10,13,16-hexaoxacyclooctadecane. FIG. 3b is 15-Crown-5, also known by the IUPAC name 1,4,7,10,13-pentoxacyclopentadecane. FIG. 3c is Cryptand [2,2,2], also known by the IUPAC name 4,7,13,16,21,24-hexoxa-1,10-diazabicyclo [8,8,8] hexacosane. FIG. 3d is hexamethyl hexacyclen.

SUMMARY, RAMIFICATIONS, AND SCOPE

The present invention provides methods for making electrodes either made from or coated with an electride or alkalide material in which the electride or alkalide material has lattice defect sites. These are regions of the crystal structure where irregularities and deformations occur.

The present invention also provides methods for making electrodes which consist of a substrate coated with a layer of a compound comprised of a cation complexed by an electride former, in which said complex has lattice defect sites, thereby providing a surface having a low work-function. In a preferred embodiment, the electride former is a heterocyclic multidentate ligand.

Specific materials and ligands have been described, however other materials may be considered, as well as other ligands. Metal cations have been specified, but other cations such as ammonium or substituted ammonium, may be used.

Although the above specification contains many specificities, these should not be construed as limiting the scope of the invention but as merely providing illustrations of some of the presently preferred embodiments of this invention. For example, no specification has been given for surface morphology. While the specification is for a layer of ligand upon a surface, this surface may be flat, formed into a shape suitable for a particular application, microstructured to enhance emission using field emission techniques, microstructured to increase surface area, or otherwise altered in physical configuration.

No specification has been given for electrode size. While large area electrodes such as are used in conventional vacuum tubes, thermionic converters, and the like are facilitated by the present invention, microfabricated vacuum electronic devices are also possible. The present invention may be used to facilitate the production of flat panel displays, integrated vacuum microcircuits, or vacuum microelectronic mechanical systems.

Thus the scope of the invention should be determined by the appended claims and their legal equivalents, rather than by the examples given.

We claim:

1. A method for making a low work function electrode comprising the steps of:
   a) providing an electrode;
   b) depositing an electride material on said electrode, wherein said electride material has lattice defect sites;
   c) providing a second electrode; and
   d) providing a space between said electride material and said second electrode, wherein said space comprises a vacuum, wherein said vacuum is in contact with said electride material.

2. The method of claim 1, wherein said electride material has been deposited on said electrode by vacuum deposition.

3. The method of claim 1, wherein said electride material has been deposited on said electrode by solution deposition.

4. The method of claim 1, wherein said electride material comprises, a mixture of a first electride former and a second electride former, wherein said first electride former forms a crystal lattice and said second electride former forms said lattice defects.

5. The method of claim 4, wherein said mixture is formed in situ.

6. The method of claim 4 wherein said first electride former and said second electride former have different degrees of structural stability.

7. The method of claim 4 wherein in said electride material, said first electride is in greater abundance than said second electride.

8. The method of claim 4 wherein at least one of said electride formers is a heterocyclic multidentate ligand.

9. The method of claim 6 wherein said heterocyclic multidentate ligand is selected from the group consisting of crown-ethers, cryptands, aza-crown-ethers, cyclic-silicones, and thio-crown-ethers.

10. The method of claim 8 wherein said heterocyclic multidentate ligand is selected from the group consisting of 15-Crown-5, 18-Crown-6, Cryptand [2.2.2] and hexamethyl hexacyclen.

11. The method of claim 1, wherein said electride material comprises cations complexed by an electride former.

12. The method of claim 11 wherein a source of said cations is a metal, an alloy or a non-metal.

13. The method of claim 11 wherein said cations are complexed by causing a solid-state reaction between a source of said cations and said electride material.

14. The method of claim 11 wherein a source of said cations is a cationic form of a metal selected from the group consisting of alkali metals, alkaline earth metals, lanthanides, and actinides.

15. The method of claim 11 wherein said source of cations is a cationic form of transition metal.

16. The method of claim 1 wherein said electride material forms a monolayer on said electrode.

17. The method of claim 1 wherein said electrode comprises a material selected from the group consisting of quartz, glass, silicon, silica sapphire and diamond.

18. The method of claim 1 wherein said electrode comprises a material selected from the group consisting of polycarbonate, polystyrene, polypropylene and polyethylene.

19. The method of claim 1, further comprising creating a vacuum diode heat pump comprising said electrode with said electride material and said second electrode.

20. The method of claim 1, further comprising creating a vacuum diode thermionic converter comprising said electrode with said electride material and said second electrode.

21. The method of claim 1, wherein said electrode comprises a metal.

22. The method of claim 21 wherein said metal is selected from the group consisting of an alkali metal, an alkaline earth metal, a lanthanide metal, and an actinide metal.

23. The method of claim 21 wherein said metal comprises a layer that is less than one micron in thickness.

24. The method of claim 21 wherein said metal comprises nickel coated with a layer of a second metal.

25. The method of claim 24 wherein said second metal is selected from the group consisting of an alkali metal, an alkali earth metal, a lanthanide metal, and an actinide metal.

26. The method of claim 24 wherein said metal comprises a tungsten derivative.

27. The method of claim 26 wherein said tungsten derivative is selected from the group consisting of thoriated tungsten, carburized thoriated tungsten and cesiated tungsten.

* * * * *